United States Patent
Jackson et al.

(10) Patent No.: US 9,667,312 B2
(45) Date of Patent: May 30, 2017

(54) RADIO BASED AUTOMATIC LEVEL CONTROL FOR LINEAR RADIO CALIBRATION

(71) Applicant: Hughes Network Systems, LLC, Germantown, MD (US)

(72) Inventors: Thomas Jackson, Monrovia, MD (US); Rajesh Joshi, Clarksburg, MD (US); Michael Dauberman, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 4 days.

(21) Appl. No.: 14/596,050

(22) Filed: Jan. 13, 2015

(65) Prior Publication Data
US 2016/0204828 A1 Jul. 14, 2016

(51) Int. Cl.
*H04B 3/54* (2006.01)
*H04B 3/30* (2006.01)
(Continued)

(52) U.S. Cl.
CPC .............. *H04B 3/30* (2013.01); *H03G 3/3042* (2013.01); *H04B 3/54* (2013.01); *H04B 17/11* (2015.01); *H04B 17/12* (2015.01)

(58) Field of Classification Search
CPC .......... H04B 2210/003; H04B 10/2942; H04B 10/2931; H04B 10/0777; H04B 10/07955;
(Continued)

(56) References Cited

U.S. PATENT DOCUMENTS

| | | | | |
|---|---|---|---|---|
| 4,777,653 A | * | 10/1988 | Bonnerot | H04W 52/20 375/285 |
| 5,033,109 A | * | 7/1991 | Kawano | H04M 1/72519 455/575.7 |

(Continued)

FOREIGN PATENT DOCUMENTS

| EP | 0771069 B1 | 7/2004 |
|---|---|---|
| EP | 1672786 A1 | 6/2006 |

OTHER PUBLICATIONS

International Search Report for corresponding PCT Application PCT/US2016/012898 mailed May 13, 2016.

*Primary Examiner* — Emmanuel Bayard
(74) *Attorney, Agent, or Firm* — Edell, Shapiro & Finnan LLC; Richard C. Irving

(57) ABSTRACT

A linear radio and a method for performing automatic level control are provided. A demultiplexer, within the linear radio, receives multiplexed signals from an indoor unit via a cable connecting the indoor unit with the linear radio. The demultiplexer demultiplexes the multiplexed signals to produce a transmit signal of an intermediate frequency. A variable gain amplifier within the linear radio, receives the transmit signal and a signal from an operational amplifier and produces the transmit signal with a changed gain, which is provided to a coupler. The coupler provides the transmit signal with the changed gain to a mixer and a power detector simultaneously. The power detector produces a second signal, which is provided to the operational amplifier, thereby forming a closed automatic level control loop. In some embodiments, the demultiplexer produces a power control signal, which is provided to the operational amplifier as a second input.

16 Claims, 5 Drawing Sheets

(51) Int. Cl.
*H04B 17/11* (2015.01)
*H03G 3/30* (2006.01)
*H04B 17/12* (2015.01)

(58) Field of Classification Search
CPC .............. H04B 10/2575; H04B 10/035; H04L 2027/0053
USPC ................................ 375/344–345, 257, 297
See application file for complete search history.

(56) References Cited

U.S. PATENT DOCUMENTS

| | | | | |
|---|---|---|---|---|
| 5,129,098 A * | 7/1992 | McGirr | H03G 3/3042 | 455/126 |
| 5,303,268 A * | 4/1994 | Tsutsumi | H03G 3/3047 | 375/296 |
| 5,386,589 A * | 1/1995 | Kanai | H04L 1/20 | 455/423 |
| 5,408,197 A * | 4/1995 | Miyake | H03G 3/3047 | 330/129 |
| 5,457,811 A * | 10/1995 | Lemson | H03G 3/3052 | 398/209 |
| 5,463,487 A * | 10/1995 | Epworth | H04B 10/2912 | 398/157 |
| 5,559,809 A * | 9/1996 | Jeon | H04B 7/18517 | 370/481 |
| 5,568,135 A * | 10/1996 | Shinozaki | H04B 17/17 | 340/3.1 |
| 5,574,993 A * | 11/1996 | Kobayashi | H03G 3/3042 | 455/126 |
| 5,664,131 A * | 9/1997 | Sugiya | H01S 3/06758 | 359/337.13 |
| 5,680,246 A * | 10/1997 | Takahashi | H01S 3/1301 | 359/341.43 |
| 5,717,510 A * | 2/1998 | Ishikawa | H04L 7/0037 | 398/147 |
| 5,724,003 A * | 3/1998 | Jensen | G06G 7/24 | 330/129 |
| 5,724,645 A * | 3/1998 | Na | H04H 40/90 | 455/127.1 |
| 5,752,172 A * | 5/1998 | Matero | H01Q 23/00 | 455/127.3 |
| 5,809,395 A * | 9/1998 | Hamilton-Piercy | H04W 88/085 | 370/489 |
| 5,809,420 A * | 9/1998 | Ichiyanagi | H03G 3/3047 | 455/103 |
| 5,812,710 A * | 9/1998 | Sugaya | H01S 3/1301 | 359/337 |
| 6,014,553 A | 1/2000 | Kim | | |
| 6,038,063 A * | 3/2000 | Tsuda | H01S 3/1301 | 359/341.41 |
| 6,038,432 A * | 3/2000 | Onoda | H01Q 3/2605 | 330/129 |
| 6,052,572 A * | 4/2000 | Imura | H03G 1/0088 | 340/7.32 |
| 6,088,570 A * | 7/2000 | Komara | H04B 7/0802 | 370/321 |
| 6,230,031 B1 * | 5/2001 | Barber | H01Q 1/242 | 455/127.3 |
| 6,246,873 B1 * | 6/2001 | Flowers | H04N 7/15 | 348/E7.083 |
| 6,259,682 B1 * | 7/2001 | Brown | H04W 52/367 | 370/311 |
| 6,275,684 B1 * | 8/2001 | Kaneko | H03G 3/3042 | 330/129 |
| 6,286,994 B1 * | 9/2001 | Boesel | H04W 52/225 | 374/146 |
| 6,473,603 B1 * | 10/2002 | Toncich | H04B 1/3877 | 455/13.4 |
| 6,484,017 B1 * | 11/2002 | Kim | H04B 1/04 | 330/280 |
| 6,515,777 B1 * | 2/2003 | Arnold | H04B 10/0773 | 359/337 |
| 6,600,929 B1 * | 7/2003 | Toncich | H04W 52/283 | 455/129 |
| 6,603,810 B1 * | 8/2003 | Bednekoff | H04B 17/318 | 375/228 |
| 6,625,222 B1 * | 9/2003 | Bertonis | H04L 5/06 | 375/259 |
| 6,704,579 B2 * | 3/2004 | Woodhead | H04W 52/24 | 455/522 |
| 6,728,224 B1 * | 4/2004 | Kakizaki | H04W 52/52 | 330/133 |
| 6,728,520 B2 * | 4/2004 | Coan | H04B 7/18534 | 455/115.3 |
| 6,771,941 B2 * | 8/2004 | Kim | H04W 52/52 | 455/127.2 |
| 6,795,712 B1 * | 9/2004 | Vakilian | H03F 1/0211 | 370/335 |
| 6,870,666 B2 * | 3/2005 | Wada | H04B 10/296 | 359/337 |
| 6,871,053 B2 * | 3/2005 | Shibuya | H03G 3/3036 | 455/103 |
| 6,873,456 B2 * | 3/2005 | Motoshima | H04B 10/2941 | 359/337.11 |
| 6,885,246 B2 * | 4/2005 | Tsutsui | H03G 3/007 | 330/133 |
| 7,006,791 B2 * | 2/2006 | Buer | H04B 7/18513 | 370/318 |
| 7,076,201 B2 * | 7/2006 | Ammar | H04B 7/18528 | 455/127.2 |
| 7,082,290 B2 * | 7/2006 | Takano | H04L 27/368 | 375/300 |
| 7,119,950 B2 * | 10/2006 | Ohshima | H01S 3/06754 | 359/337.11 |
| 7,183,856 B2 * | 2/2007 | Miki | H03G 1/0088 | 330/285 |
| 7,196,840 B2 * | 3/2007 | Duling | H04L 25/4917 | 359/337 |
| 7,206,591 B2 * | 4/2007 | Ammar | H04B 1/40 | 455/3.01 |
| 7,236,294 B2 * | 6/2007 | Takeyama | H01S 3/06754 | 359/337 |
| 7,333,564 B2 * | 2/2008 | Sugiyama | H03G 3/3042 | 330/127 |
| 7,477,447 B2 * | 1/2009 | Sugaya | H01S 3/06758 | 359/341.41 |
| 7,515,884 B2 * | 4/2009 | Blech | H04B 17/13 | 455/115.1 |
| 7,565,124 B2 * | 7/2009 | Lee | H04W 52/52 | 375/345 |
| 7,715,093 B2 * | 5/2010 | Nishihara | H01S 3/06754 | 359/337.1 |
| 7,724,837 B2 * | 5/2010 | Filimonov | H03C 3/40 | 375/295 |
| RE41,936 E * | 11/2010 | Woodhead | H04W 52/24 | 455/426.2 |
| 7,826,810 B2 * | 11/2010 | Carmel | H04B 1/0003 | 330/2 |
| 7,843,631 B2 * | 11/2010 | Onaka | H01S 3/1301 | 359/341.41 |
| 7,873,333 B2 * | 1/2011 | Tanaka | H03G 1/0088 | 455/126 |
| 7,873,334 B2 * | 1/2011 | Itkin | H03G 3/3042 | 455/126 |
| 7,899,331 B2 * | 3/2011 | Itoh | H04J 14/0221 | 359/337.1 |
| 8,073,387 B2 * | 12/2011 | Maslennikov | H04B 7/15578 | 455/11.1 |
| 8,077,384 B2 * | 12/2011 | Mori | H04B 10/2935 | 359/334 |
| 8,081,935 B2 * | 12/2011 | Liang | H04B 1/0483 | 375/297 |
| 8,116,413 B2 * | 2/2012 | Giard | H03G 3/3089 | 375/230 |
| 8,120,433 B2 * | 2/2012 | Kim | H03B 21/02 | 327/105 |

(56) References Cited

U.S. PATENT DOCUMENTS

| | | | | |
|---|---|---|---|---|
| 8,213,888 B2* | 7/2012 | Kuriyama | H03G 3/02 | 330/278 |
| 8,229,373 B2* | 7/2012 | Tanoue | H03F 1/0261 | 455/114.1 |
| 8,326,156 B2* | 12/2012 | Stewart | H04B 10/25753 | 398/115 |
| 8,358,985 B2* | 1/2013 | Nomura | H03J 1/0008 | 455/150.1 |
| 8,457,570 B2* | 6/2013 | Sahota | H04B 17/13 | 455/126 |
| 8,547,629 B2* | 10/2013 | Inagaki | H01S 3/06758 | 39/337 |
| 8,559,871 B2* | 10/2013 | Kim | H04B 7/18528 | 455/12.1 |
| 8,620,160 B2* | 12/2013 | Onaka | H04B 10/07955 | 398/158 |
| 8,649,741 B2* | 2/2014 | Iijima | H03K 17/6221 | 333/103 |
| 8,670,176 B2* | 3/2014 | Naito | H04B 10/2935 | 359/337.4 |
| 8,674,768 B2* | 3/2014 | Dally | H03G 3/3036 | 330/278 |
| 8,688,157 B2* | 4/2014 | Wang | H04B 7/0408 | 455/450 |
| 8,744,385 B2* | 6/2014 | Yahav | H03D 7/00 | 342/100 |
| 8,792,840 B2* | 7/2014 | Khlat | H03F 1/0227 | 375/297 |
| 8,948,588 B2* | 2/2015 | Sueoka | H04B 10/07955 | 398/15 |
| 8,983,400 B2* | 3/2015 | Qin | H04W 88/085 | 375/219 |
| 9,007,680 B2* | 4/2015 | Sugaya | H01S 3/06758 | 359/337.4 |
| 9,014,621 B2* | 4/2015 | Mohebbi | H04B 7/1555 | 370/315 |
| 9,083,350 B1* | 7/2015 | Posner | H03F 1/3247 | |
| 9,088,258 B2* | 7/2015 | Ichitsubo | G06F 1/181 | |
| 9,160,284 B2* | 10/2015 | Matsumoto | H03F 3/21 | |
| 9,247,496 B2* | 1/2016 | Khlat | H04W 52/0209 | |
| 9,270,321 B2* | 2/2016 | Shen | H04B 1/40 | |
| 9,276,545 B2* | 3/2016 | Chan | H03G 3/3042 | |
| 2001/0023190 A1* | 9/2001 | Kim | H04W 52/52 | 455/522 |
| 2002/0127990 A1* | 9/2002 | Bollenbeck | H03G 3/3047 | 455/293 |
| 2002/0164959 A1* | 11/2002 | Olsen | H01Q 1/125 | 455/73 |
| 2003/0022694 A1* | 1/2003 | Olsen | G01V 8/005 | 455/562.1 |
| 2003/0152140 A1* | 8/2003 | Antoniak | G08C 15/12 | 375/219 |
| 2003/0176202 A1* | 9/2003 | Bartl | H03G 3/3042 | 455/522 |
| 2004/0166802 A1* | 8/2004 | McKay, Sr. | H04B 7/15535 | 455/15 |
| 2004/0246891 A1* | 12/2004 | Kay | H04L 27/0008 | 370/215 |
| 2006/0030283 A1* | 2/2006 | Katagishi | H04B 1/52 | 455/130 |
| 2006/0189285 A1* | 8/2006 | Takano | H04L 27/368 | 455/127.2 |
| 2007/0165299 A1* | 7/2007 | Sugaya | H01S 3/06758 | 359/337.4 |
| 2007/0184794 A1* | 8/2007 | Drogi | H03F 1/0205 | 455/127.1 |
| 2007/0197258 A1* | 8/2007 | Oda | H04B 10/25758 | 455/554.2 |
| 2007/0264947 A1* | 11/2007 | Rozenblit | H03G 3/3047 | 455/127.2 |
| 2008/0136559 A1* | 6/2008 | Takahashi | H03H 7/465 | 333/167 |
| 2008/0181337 A1* | 7/2008 | Maxim | H03M 1/0614 | 375/340 |
| 2008/0285640 A1* | 11/2008 | McCallister | H04L 25/03044 | 375/233 |
| 2010/0184389 A1* | 7/2010 | Fraysse | H04B 1/04 | 455/108 |
| 2011/0151777 A1 | 6/2011 | Kim et al. | | |
| 2012/0155287 A1* | 6/2012 | Huang | H04B 1/0466 | 370/242 |
| 2013/0309975 A1* | 11/2013 | Kpodzo | H04B 1/1027 | 455/63.1 |
| 2014/0073278 A1* | 3/2014 | Fan | H03G 3/3078 | 455/253.2 |
| 2014/0106827 A1* | 4/2014 | Lim | G06F 9/00 | 455/574 |
| 2014/0120853 A1* | 5/2014 | Laskar | H04B 1/40 | 455/127.2 |
| 2015/0081929 A1* | 3/2015 | Wang | G06F 13/10 | 710/8 |
| 2015/0111512 A1* | 4/2015 | Tsukizawa | H03G 3/3042 | 455/127.2 |
| 2015/0222005 A1* | 8/2015 | Jaffe | H01Q 1/1257 | 342/352 |
| 2015/0236732 A1* | 8/2015 | Nath | H04B 1/0475 | 455/114.3 |
| 2015/0249475 A1* | 9/2015 | Toosi | H04B 1/1027 | 455/226.2 |
| 2016/0233918 A1* | 8/2016 | Kennard | H04L 27/2626 | |

* cited by examiner

RADIO BASED AUTOMATIC LEVEL CONTROL FOR LINEAR RADIO CALIBRATION

FIELD OF THE INVENTION

The invention relates to an automatic level control circuit for maintaining a fixed power level for a linear radio. In particular, the invention relates to an automatic level control loop circuit, completely contained in a linear radio, for maintaining a fixed power level for a transmit signal provided to an upconverting mixer.

BACKGROUND

Signal loss occurs for signals transmitted across an RG-6 cable connecting an indoor unit with an outdoor unit. During installation, linear VSAT terminal installers may manually calibrate for signal loss between the indoor unit and the outdoor unit using separate handheld devices to measure the signal loss at an output of various components. Manual calibration may be a lengthy process, which may include introduction of human errors. After the manual calibration is completed, the manual calibration is to be repeated when any parameter related to transmit signal power between the indoor unit and the outdoor unit changes. An example of such a parameter includes, but is not limited to, a change in length of a cable connecting the indoor unit with the outdoor unit.

FIG. 1 illustrates use of a previous method for automatic calibration of linear radio transmit signals. FIG. 1 shows an indoor unit 108 connected to an outdoor linear radio 112 of an outdoor unit via a RG-6 cable 124. Indoor unit 108 includes an automatic level control circuit 104 for controlling a power level of transmit signals sent from indoor unit 108 to outdoor linear radio 112. Outdoor linear radio 112 includes a demultiplexer 114, an upconverting mixer 106, a coupler 116, and a power detector 102. In FIG. 1, indoor unit 108 may transmit multiple multiplexed signals to outdoor linear radio 112 via RG-6 cable 124. Demultiplexer 114 receives and demultiplexes the multiple signals to produce a transmit signal 118 of an intermediate frequency, as well as other signals. Upconverting mixer 106 receives transmit signal 118 and a local oscillator signal 120 to produce a transmit signal at a final output frequency 122. Coupler 116 simultaneously provides transmit signal 122 to power detector 102 and a Very Small Aperture Terminal (VSAT) antenna 126, which transmits transmit signal 122 to a destination device via a satellite. Power detector 102 measures a power level of transmit signal 122 and provides power information to automatic level control circuit 104 via a digital communication link 110.

Automatic level control circuit 104, in indoor unit 108, receives the power information as feedback, thereby causing automatic level control circuit 104 to control, based on the power information, a power level of transmit signals transmitted to outdoor linear radio 112 via RG-6 cable 124 connecting indoor unit 106 with outdoor linear radio 112.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In a first embodiment, a method is provided for performing radio based automatic level control for linear radio calibration. A demultiplexer of a linear radio receives multiplexed signals communicated via a cable connecting the linear radio with a second unit. The multiplexed signals are demultiplexed to produce a transmit signal of an intermediate frequency. A variable gain amplifier of the linear radio receives the transmit signal and a signal from an operational amplifier and produces the transmit signal with a changed gain. The transmit signal with the changed gain is provided to a coupler, which further provides the signal with the changed gain to a mixer and a power detector simultaneously, thereby forming a closed automatic level control loop.

In a second embodiment and outdoor linear radio is provided. The outdoor linear radio includes an automatic level control loop, which is completely included in the outdoor linear radio. The automatic level control loop receives a transmit signal of an intermediate frequency and produces a power controlled transmit signal. The automatic level control loop automatically adjust a gain of the transmit signal based on an amount of power detected in the power controlled transmit signal.

DRAWINGS

In order to describe the manner in which the above-recited and other advantages and features can be obtained, a more particular description is provided below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure.

Overview

An outdoor linear radio is provided, which includes a complete automatic level control circuit within the outdoor linear radio. The automatic level control circuit receives a transmit signal of an intermediate frequency. A power detector measures a power level of the transmit signal and feeds back power information from the power detector to a variable gain amplifier, such that a power level of the transmit signal of the intermediate frequency is controlled based on the power information provided to the variable gain amplifier.

Various embodiments eliminate use of a digital communication link between the power detector and an indoor unit, thereby providing a less complicated, more reliable, and less expensive solution for performing power level control of transmit signals. Further, detecting power of the transmit signal of the intermediate frequency is less complicated than detecting power of a transmit signal of a final output frequency, including but not limited to, an output frequency in a Ka band. In addition, changes to parameters such as, for example, a cable length between the indoor unit and the outdoor linear radio, will not negatively affect power control of the transmit signal performed by the automatic level control circuit within the outdoor linear radio. Because manual calibration of power control becomes unnecessary, introduction of human errors during calibration is eliminated.

Exemplary Operating Environment

Figure 1:
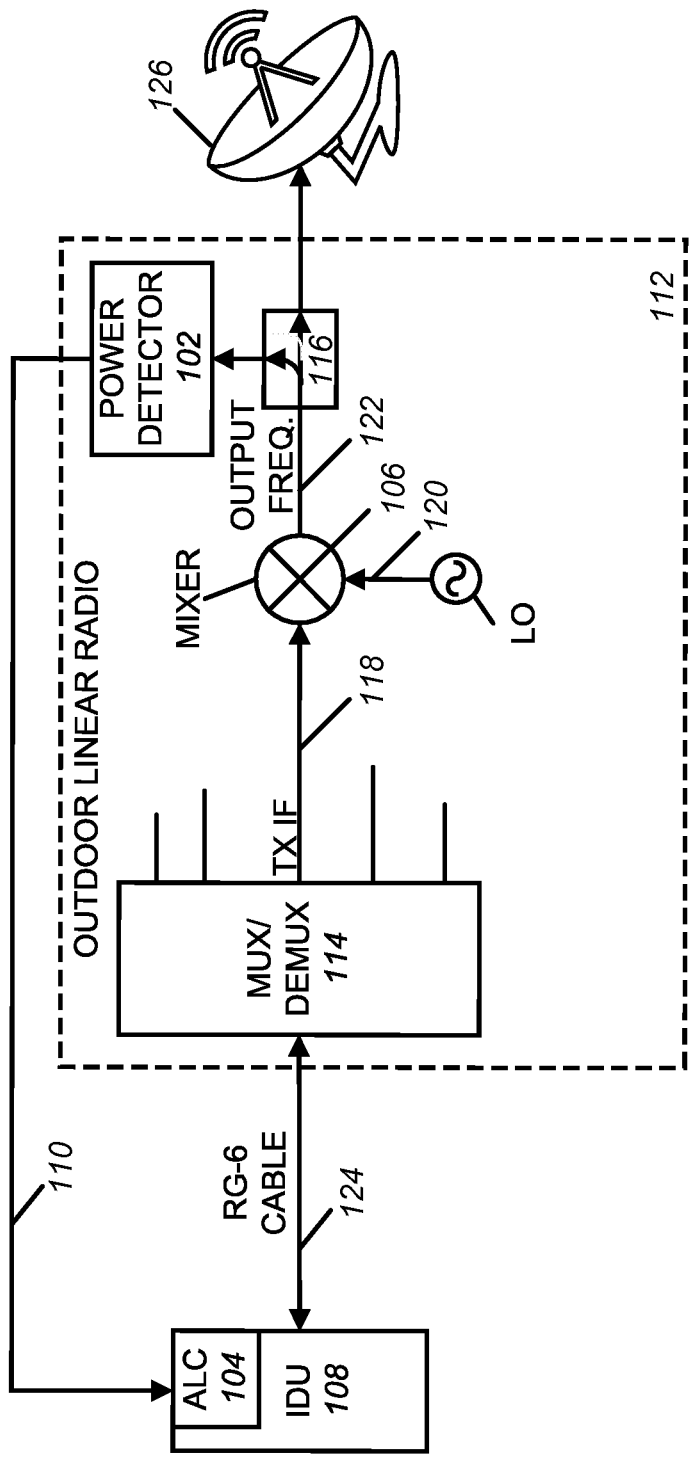
FIG. 1 illustrates an existing system that measures power of a transmit signal of a final output frequency, reports power information to an indoor unit via a communication link connecting a linear radio with an indoor unit, and performs automatic level control in the indoor unit.
Figure 2:
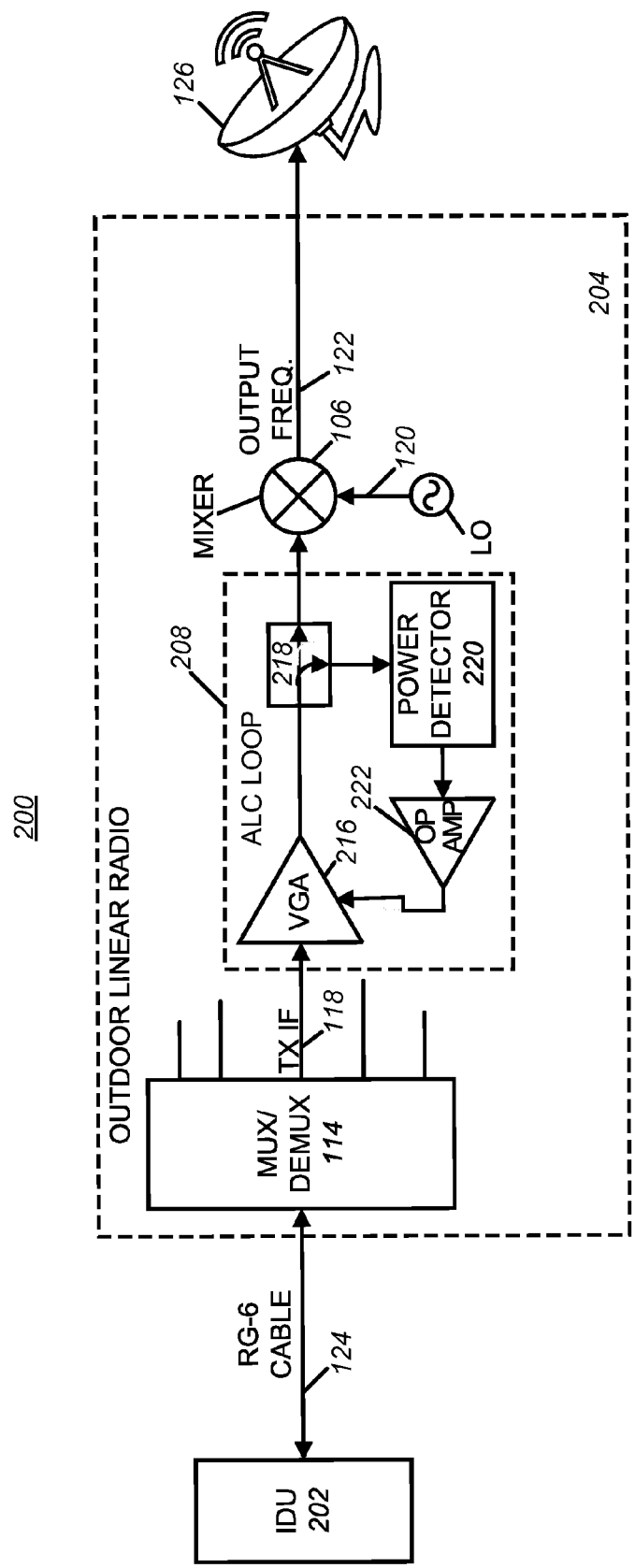
FIG. 2 illustrates an embodiment in which an automatic level control loop is completely contained within an outdoor linear radio.

FIG. 2 shows an exemplary operating environment 200 for various embodiments. Operating environment 200 includes an indoor unit 202 and an outdoor linear radio 204 of an outdoor unit. A cable 124, which may be a RG-6 cable or other cable, may connect indoor unit 202 with outdoor linear radio 204 of an outdoor unit. Outdoor linear radio 204 may include a demultiplexer 114, an automatic level control circuit loop 208, and an upconverting mixer 106. Automatic level control circuit loop 208 may include a variable gain amplifier 216, a coupler 218, a power detector 220, and an operational amplifier 222. Transmitted signals of a final output frequency 122 may be provided to an antenna 126, including but not limited to a Very Small Aperture Terminal (VSAT) antenna.

Figure 4:
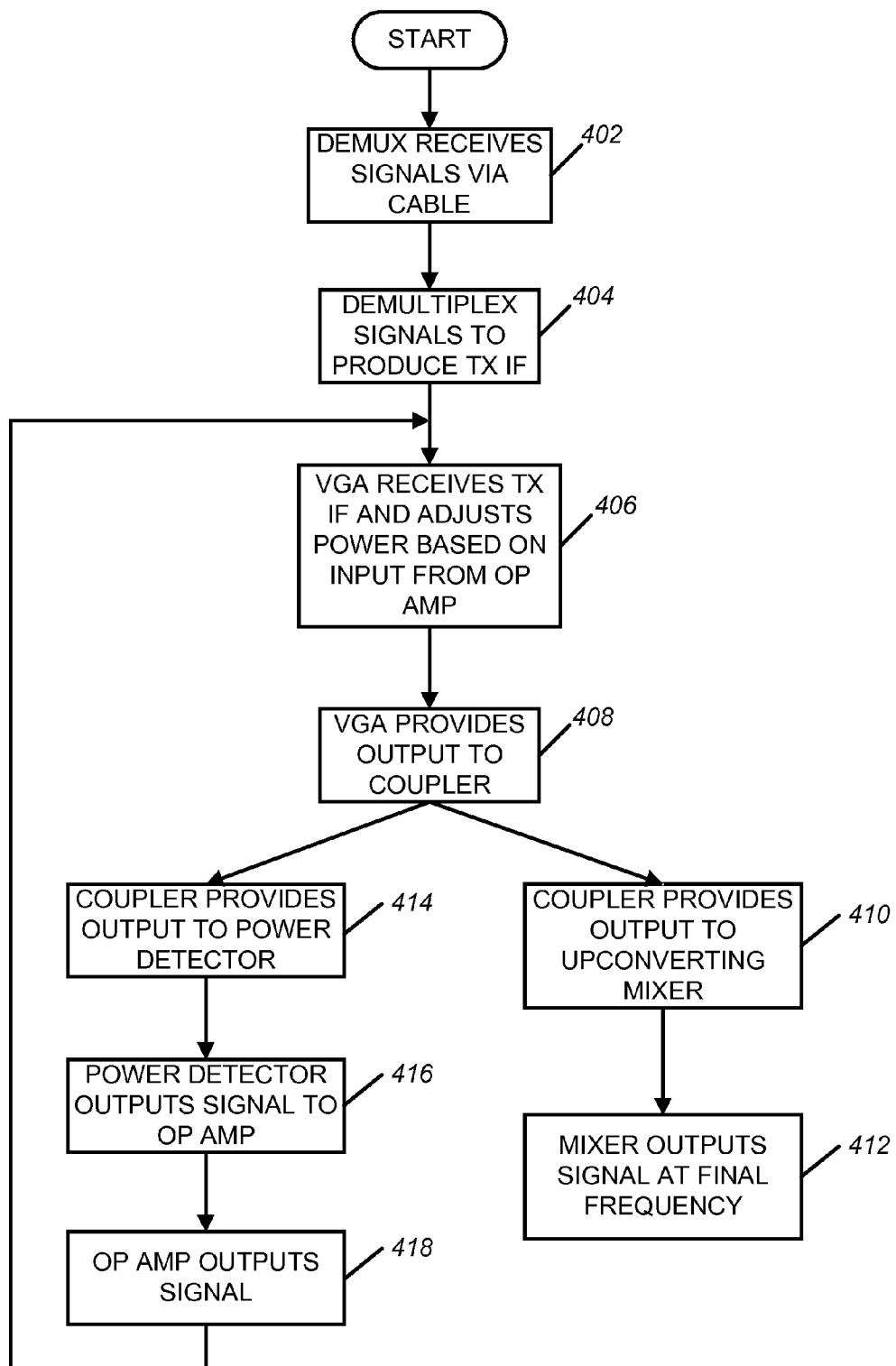
FIG. 4 is a flowchart which helps explain operation of the embodiment of FIG. 2.

Operation of indoor unit 202 and outdoor linear radio 204 will be explained with reference to FIG. 4. Indoor unit 202 may transmit multiple signals, which are received by demultiplexer 114 of outdoor linear radio 302 (act 402). Demultiplexer 114 may demultiplex the received multiple signals to produce a transmit signal of an intermediate frequency 118 (act 404). Variable gain amplifier 216 of automatic level control circuit loop 208 may receive transmit signal 118 and may adjust a power level of transmit signal 118 based on input from operational amplifier 222 (act 406). Variable gain amplifier 216 may provide transmit signal 118, with the adjusted power level, to coupler 218 (act 408).

Coupler 218 may then simultaneously provide transmit signal 118 to power detector 220 (act 414) and upconverting mixer 106 (act 410). Upconverting mixer 106 may mix transmit signal 118 at the intermediate frequency with a local oscillator signal 120 to provide a transmit signal of a final output frequency (act 412). In one embodiment, the final output frequency may be in a Ka band between 28 GHz to 30 GHz. In other embodiments, the final output frequency may be in a Ku band, an X band, a Z band, a C band, or another band.

Power detector 220 may detect an amount of power of transmit signal 118 and may output a signal indicating the amount of power to operational amplifier 222 (act 416). Operational amplifier 222 may then output an amplified control signal, based on the signal indicating the amount of power, to variable gain amplifier 216 (act 418), thereby completing the automatic level control circuit loop. Variable gain amplifier 206 may adjust a power level of transmit signal 118 based on the amplified control signal provided by operational amplifier 222.

Variation of Above Embodiment

Figure 3:
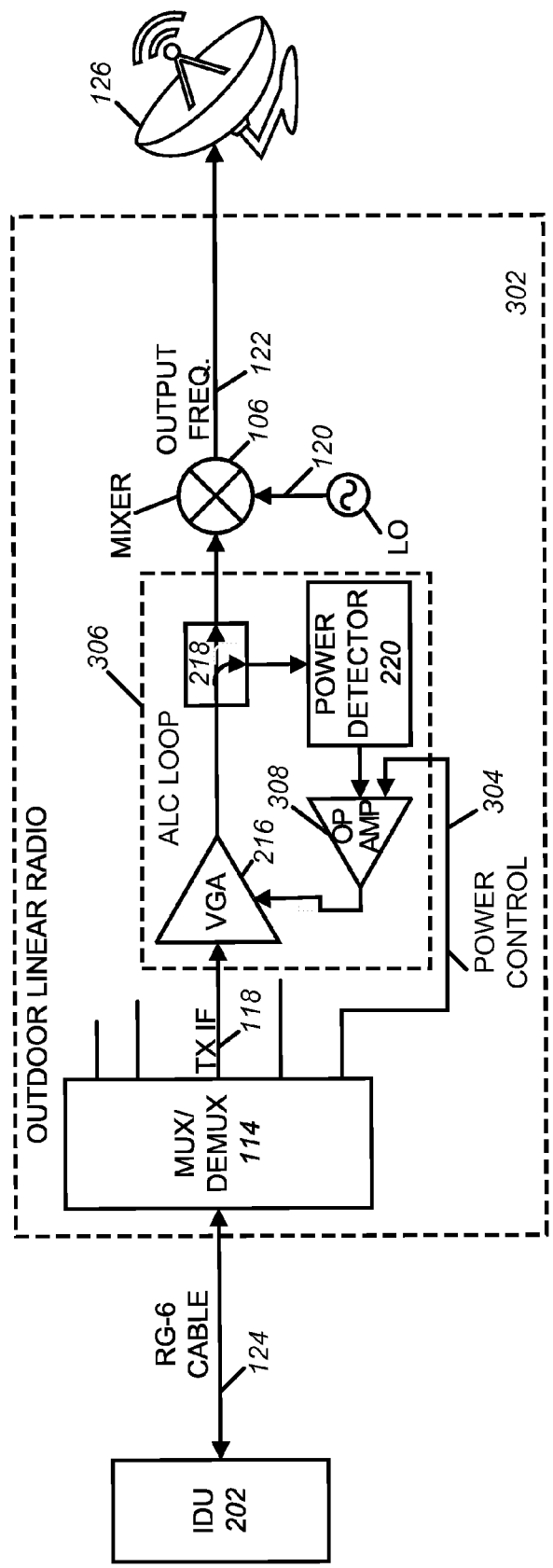
FIG. 3 illustrates a variation of the embodiment of FIG. 2 in which a power control signal is demultiplexed and provided to an operational amplifier of an automatic level control loop completely contained within an outdoor linear radio.

FIG. 3 shows a variation of the embodiment of FIG. 2. A difference between FIG. 2 and FIG. 3 is a power control signal 304 produced by demultiplexer 114 of outdoor linear radio 302 after demultiplexing the multiple signals received from indoor unit 202. Power control signal 304 may be provided to operational amplifier 308 of automatic level control circuit loop 306. An amplified control signal output by operational amplifier 308 is based on the signal representing the amount of power detected by power detector 220 and power control signal 304. As a result, indoor unit 202 may transmit power control signal 304 within the transmitted multiple signals provided to outdoor linear radio 302 in order to adjust a power level of transmit signal 118 output from variable gain amplifier 216 when weather conditions change.

Figure 5:
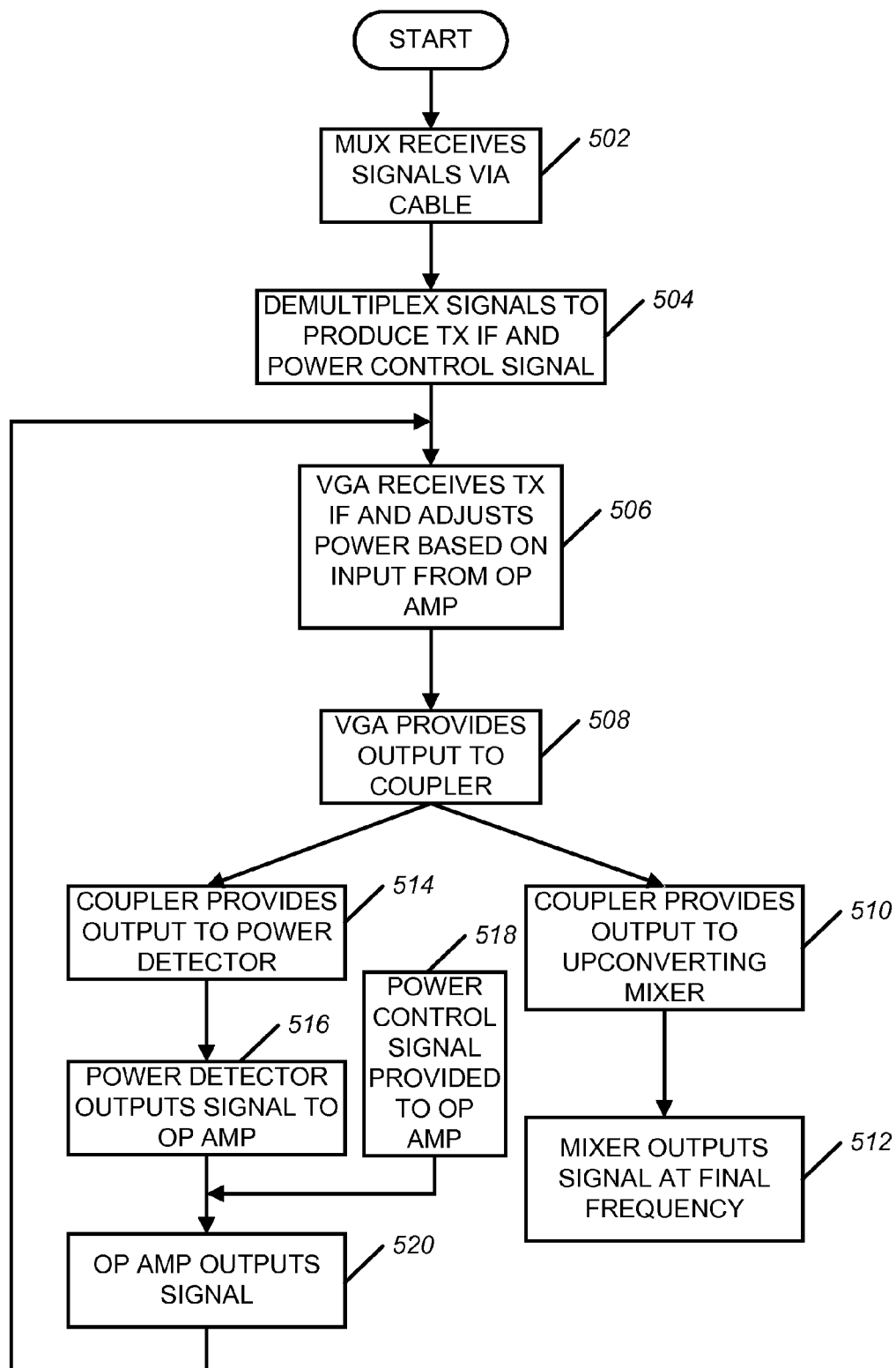
FIG. 5 is a flowchart which helps explain operation of the embodiment of FIG. 3.

Operation of indoor unit 202 and outdoor linear radio 302 will be explained with reference to FIGS. 5 and 3. Indoor unit 202 may transmit multiple signals, which are received by demultiplexer 114 of outdoor linear radio 302 (act 502). Demultiplexer 114 may demultiplex the received multiple signals to produce transmit signal of an intermediate frequency 118 and power control signal 304 (act 504). Variable gain amplifier 216 of automatic level control circuit loop 306 may receive transmit signal 118 and may adjust a power level of transmit signal 118 based on input from operational amplifier 222 (act 506). Variable gain amplifier 216 may provide transmit signal 118, with the adjusted power level, to coupler 218 (act 508).

Coupler 218 may then simultaneously provide transmit signal 118 to power detector 220 (act 514) and upconverting mixer 106 (act 510). Upconverting mixer 106 may mix transmit signal 118 at the intermediate frequency with a local oscillator signal 120 to provide a transmit signal of a final output frequency (act 512). In one embodiment, the final output frequency may be in a Ka band between 28 GHz to 30 GHz. In other embodiments, the final output frequency may be in a Ku band, an X band, a Z band, a C band, or another band.

Power detector 220 may detect an amount of power of transmit signal 118 and may output a signal indicating the amount of power to operational amplifier 308 (act 516). Meanwhile, power control signal 304 may be provided to operational amplifier 308 from demultiplexer 114 (act 518). Operational amplifier 308 may then output an amplified control signal, based on the signal indicating the amount of power from power detector 220 and power control signal 304, to variable gain amplifier 216 (act 520), thereby completing the automatic level control circuit loop. Variable gain amplifier 216 may adjust a power level of transmit signal 118 based on the amplified control signal provided by operational amplifier 308.

CONCLUSION

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Although the above descriptions may contain specific details, they should not be construed as limiting the claims in any way. Other configurations of the described embodiments are part of the scope of this disclosure. Further, implementations consistent with the subject matter of this disclosure may have more or fewer acts than as described, or may implement acts in a different order than as shown. Accordingly, the appended claims and their legal equivalents should only define the invention, rather than any specific examples given.

The invention claimed is:

1. A method for performing radio based automatic level control for linear radio calibration, the method comprising:
   receiving, by a demultiplexer of a linear radio, a multiplexed plurality of signals from a second unit, the plurality of signals being communicated via a cable connecting the second unit with the linear radio;
   demultiplexing the multiplexed plurality of signals, by the demultiplexer, to produce a transmit signal of an intermediate frequency;
   receiving the transmit signal by a variable gain amplifier of the linear radio, the variable gain amplifier further receiving a signal from an operational amplifier, based on a signal indicating an amount of power of the transmit signal, and producing the transmit signal with a changed power gain;
   providing the transmit signal with the changed power gain to a coupler, the coupler providing the signal with the changed power gain to a mixer and a power detector simultaneously; and
   providing a second signal from the power detector to the operational amplifier, thereby forming a closed automatic level control loop.

2. The method of claim 1, wherein the cable is a RG-6 cable.

3. The method of claim 1, wherein the mixer further receives a signal from a local oscillator and the method further comprises:
   producing, by the mixer, an output signal of an output frequency based on the signal from the local oscillator and the signal with the changed power gain.

4. The method of claim 3, wherein the output frequency is in a Ka band.

5. The method of claim 4, wherein the output frequency is between 28 GHz to 30 GHz.

6. The method of claim 3, wherein the output frequency is in a Ku band.

7. The method of claim 3, wherein the output frequency is in a band selected from a group of bands consisting of an X band, a Z band, and a C band.

8. An outdoor linear radio comprising:
   an automatic level control loop, completely included in the outdoor linear radio, to receive a transmit signal of an intermediate frequency and to produce a power controlled transmit signal, the automatic level control loop automatically adjusting a power gain of the transmit signal based on an amount of power detected in the power controlled transmit signal, the automatic level control loop further comprising:
   a power detector,
   a variable gain amplifier to receive the transmit signal of the intermediate frequency and to produce the power controlled transmit signal,
   a coupler to receive the power controlled transmit signal and to simultaneously provide the power controlled transmit signal to a mixer and the power detector, and
   an operational amplifier to receive a signal from the power detector, the signal indicating an amount of power detected, wherein:
   output of the operational amplifier is further provided as input to the variable gain amplifier, thereby closing the automatic level control loop.

9. The outdoor linear radio of claim 8, further comprising:
   a demultiplexer to receive a plurality of signals via a cable and demultiplex the plurality of signals to produce the transmit signal of the intermediate frequency which is provided as input to the variable gain amplifier, and
   the demultiplexer is further to produce a power control signal from the received plurality of signals, and provide the power control signal as input to the operational amplifier.

10. An outdoor linear radio comprising:
    an automatic level control loop, completely included in the outdoor linear radio, to receive a transmit signal of an intermediate frequency and to produce a power controlled transmit signal, the automatic level control loop automatically adjusting a power gain of the transmit signal based on an amount of power detected in the power controlled transmit signal, the automatic level control loop further comprising
    an upconverting mixer to receive the power controlled transmit signal and to produce an output signal having a final output frequency.

11. The outdoor linear radio of claim 10, wherein the final output frequency is in a Ka band.

12. The outdoor linear radio of claim 10, wherein the final output frequency is between 28 GHz to 30 GHz.

13. The outdoor linear radio of claim 10, wherein the final output frequency is in a band selected from a group of bands consisting of a Ka band, a Ku band, an X band, a Z band, and a C band.

14. An outdoor linear radio comprising:
    an automatic level control loop, completely included in the outdoor linear radio, to receive a transmit signal of an intermediate frequency and to produce a power controlled transmit signal, the automatic level control loop automatically adjusting a power gain of the transmit signal based on an amount of power detected in the power controlled transmit signal, the automatic level control loop further comprising
    a demultiplexer to receive a plurality of signals via a cable and demultiplex the plurality of signals to produce the transmit signal of the intermediate frequency which is provided to the automatic level control loop.

15. The outdoor linear radio of claim 14, wherein the cable is a RG-6 cable.

16. The outdoor linear radio of claim 14, wherein the plurality of signals are transmitted via the cable in a frequency range from 950 MHz to 2 GHz.

* * * * *